(12) United States Patent
Fujii

(10) Patent No.: US 10,551,740 B2
(45) Date of Patent: Feb. 4, 2020

(54) TRANSPARENT SUBSTRATE WITH ANTIREFLECTIVE FILM HAVING SPECIFIED LUMINOUS TRANSMITTANCE AND LUMINOUS REFLECTANCE

(71) Applicant: AGC Inc., Chiyoda-ku (JP)

(72) Inventor: Kensuke Fujii, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 15/869,727

(22) Filed: Jan. 12, 2018

(65) Prior Publication Data

US 2018/0203354 A1    Jul. 19, 2018

(30) Foreign Application Priority Data

Jan. 16, 2017  (JP) .................................. 2017-005124

(51) Int. Cl.
*G02B 1/115* (2015.01)
*G02F 1/00* (2006.01)
(Continued)

(52) U.S. Cl.
CPC .............. *G03F 7/091* (2013.01); *C03C 3/045* (2013.01); *G02F 1/0063* (2013.01);
(Continued)

(58) Field of Classification Search
CPC ......... B32B 17/10201; B32B 17/10211; B32B 17/10238; B32B 17/10431; B32B 17/1044; B32B 17/10614; B32B 2307/42; C01P 2006/64; C03C 3/045; C03C 17/3417; C03C 19/00; C03C 2217/73; C03C 2217/734; G02B 1/11; G02B 1/113; G02B 1/115; G02B 1/18; G02B 5/0242; G02B 5/0294; G02B 5/206; G02B 5/22; G02B 5/226; G02F 1/0063; G02F 1/13338; G02F 2201/08; G02F 2201/38; G03F 1/46; G03F 3/03547; G03F 7/091; G06F 2203/04103; H01L 23/5329; H01L 23/5383
USPC .......... 252/582; 345/173–178; 359/359, 577, 359/580, 585, 586, 588, 601, 609, 614, 359/885; 428/1.3, 1.5, 1.6, 402
See application file for complete search history.

(56) References Cited

U.S. PATENT DOCUMENTS 6,040,939 A * 3/2000 Demiryont .............. C03C 17/36
    359/360
6,589,658 B1 * 7/2003 Stachowiak ............ C03C 17/36
    428/426

(Continued)

FOREIGN PATENT DOCUMENTS

JP            10-096801        4/1998

*Primary Examiner* — Ryan S Dunning
(74) *Attorney, Agent, or Firm* — Oblon, McClelland, Maier & Neustadt, L.L.P.

(57) ABSTRACT

Provided is an antireflective-film attached transparent substrate, which contains a transparent substrate having two principal surfaces and an antireflective film formed on one of the principal surfaces of the transparent substrate, in which the antireflective-film attached transparent substrate has a luminous transmittance being in a range of 20% to 85% and a b* value of a transmission color being 5 or smaller under a D65 light source, and the antireflective film has a luminous reflectance being 1% or lower and a sheet resistance being $10^4 \Omega/\square$ or higher.

15 Claims, 1 Drawing Sheet

(51) Int. Cl.
*C03C 3/04* (2006.01)
*G03F 7/09* (2006.01)
*H01L 23/532* (2006.01)
*H01L 23/538* (2006.01)
*G02B 1/11* (2015.01)
*G02B 1/113* (2015.01)

(52) U.S. Cl.
CPC ...... *H01L 23/5329* (2013.01); *H01L 23/5383* (2013.01); *G02B 1/11* (2013.01); *G02B 1/113* (2013.01); *G02B 1/115* (2013.01)

(56) References Cited

U.S. PATENT DOCUMENTS

| | | | |
|---|---|---|---|
| 2008/0199671 A1* | 8/2008 | Miyagi | B32B 17/10036 428/216 |
| 2014/0009835 A1* | 1/2014 | Shibuya | G02B 1/111 359/586 |
| 2014/0335335 A1* | 11/2014 | Koch, III | G02B 1/105 428/213 |

\* cited by examiner

TRANSPARENT SUBSTRATE WITH ANTIREFLECTIVE FILM HAVING SPECIFIED LUMINOUS TRANSMITTANCE AND LUMINOUS REFLECTANCE

TECHNICAL FIELD

The present invention relates to a transparent substrate with an antireflective film.

BACKGROUND ART

From the viewpoint of enhancing design appearance, a cover glass is placed in front of an image display device such as a liquid crystal display (LCD) in many cases recently. In order to prevent external light from reflecting on a screen of the display device, such a cover glass has often been provided with an antireflective film.

The cover glass is usually stuck to the image display device with an optically clear adhesive (OCA) or an optically clear resin (OCR) such as a UV curable resin. In order to enhance contrast in bright areas of the image display device, it is also desirable to suppress reflection from the interface between the image display device and the adhesive layer.

The reflection from the interface between the image display device and the adhesive layer can be suppressed by imparting light absorbency to the antireflective film. The light-absorbency imparted antireflective film has been disclosed in, for example, Patent Document 1. The light-absorptive anti-reflector disclosed in Patent Document 1 contains a light-absorptive film and a dielectric film substantially transparent to visible light, which are formed on a substrate in this order from the side of the substrate.

Here, the display surface of the image display device is sometimes required to have a function of a touch panel. However, since the light-absorptive film of the light-absorptive anti-reflector disclosed in Patent Document 1 contains gold, copper or an alloy thereof and has conductivity, the function of a touch panel cannot be imparted.

Also from the viewpoint of image quality, the light transmitted through the cover glass is desirably free from a yellowish tinge.

Patent Document 1: JP-A-H10-96801

SUMMARY OF THE INVENTION

The present invention aims to provide a transparent substrate with an antireflective film, which has light absorbency and insulating properties, and imparts no yellowish tinge to the light transmitted through the substrate.

The transparent substrate with an antireflective film according to an embodiment of the present invention is an antireflective-film attached transparent substrate, which contains a transparent substrate having two principal surfaces and an antireflective film formed on one of the principal surfaces of the transparent substrate, in which the antireflective-film attached transparent substrate has a luminous transmittance being in a range of 20% to 85% and a b* value of a transmission color being 5 or smaller under a D65 light source, and the antireflective film has a luminous reflectance being 1% or lower and a sheet resistance being $10^4 \Omega/\square$ or higher.

In the antireflective-film attached transparent substrate according to an embodiment of the present invention, it is preferable that the antireflective film has a multilayer structure built up of at least two dielectric layers differing from each other in refractive index, each dielectric layer in the multilayer structure is constituted mainly of at least one oxide selected from the group consisting of oxides of Si, Nb, Ti, Zr, Ta, Al, Sn, and In or constituted mainly of at least one nitride selected from the group consisting of nitrides of Si and Al, and at least one layer of the antireflective film with the multilayer structure contains dispersed fine particles of at least one chemical species selected from the group consisting of Ag, Mo, W, Cu, Au, Pd, Pt, Ir, Ni, Co, Fe, Cr, C, TiC, SiC, TiN, and CrN.

In the antireflective-film attached transparent substrate according to an embodiment of the present invention, it is preferable that the antireflective film has a multilayer structure built up of at least two layers differing from each other in refractive index, at least one layer of the layers in the multilayer structure is constituted mainly of silicon oxide, and at least another layer of the layers in the multilayer structure is constituted mainly of a mixed oxide of at least one oxide selected from the group consisting of oxides of Mo and W and at least one oxide selected from the group consisting of oxides of Si, Nb, Ti, Zr, Ta, Al, Sn, and In, and in which the proportion of the content of the oxide of the group B to the total content of the oxide of the group A and the oxide of the group B in the mixed oxide is lower than 50% by mass.

The antireflective-film attached transparent substrate according to an embodiment of the present invention preferably has an antifouling film on the antireflective film.

In the antireflective-film attached transparent substrate according to an embodiment of the present invention, the transparent substrate is preferably a glass substrate.

The glass substrate is preferably a chemically-strengthened glass substrate.

The principal surface of the glass substrate on which the antireflective film is to be formed, preferably has undergone an antiglare treatment.

An embodiment of the present invention can provide a transparent substrate with an antireflective film, which has light absorbency and insulating properties, and imparts no yellowish tinge to light transmitted through the substrate.

The transparent substrate with an antireflective film according to the present invention has the above-mentioned characteristics and thus, is suitable as a cover glass of an image display device, especially as a cover glass of an image display device installed in a vehicle or the like, such as an image display device of a navigation system installed in a vehicle, or the like.

MODES FOR CARRYING OUT THE INVENTION

Figure 1:
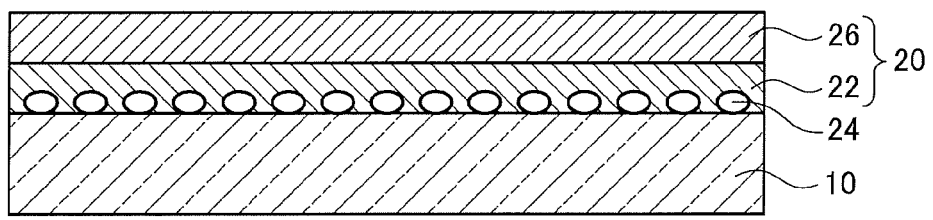
FIG. 1 is a cross-sectional diagram schematically illustrating one constitutional example of a transparent substrate with an antireflective film.

Embodiments of the present invention are described below in detail by reference to the drawings.

The transparent substrate with an antireflective film according to the present invention is an antireflective-film attached transparent substrate containing a transparent substrate having two principal surfaces and an antireflective film formed on one of the principal surfaces of the transparent substrate, in which the antireflective-film attached transparent substrate has a luminous transmittance being in a range of 20% to 85% and a b* value of a transmission color being 5 or smaller under a D65 light source, and the antireflective film has a luminous reflectance being 1% or lower and a sheet resistance being $10^4\Omega/\square$ or higher.

One embodiment of the present invention is an antireflective-film attached transparent substrate having an antireflective film on one of the principal surfaces of a transparent substrate.

The transparent substrate on which an antireflective film is formed is not particularly limited insofar as it is a transparent substrate with high translucency. In terms of strength and heat resistance, a glass substrate is preferable.

The antireflective-film attached transparent substrate according to the present invention has a luminous transmittance of 20% to 85%. The luminous transmittance in the range specified above can impart moderate light absorbency. Therefore, in the case of being used as a cover glass of an image display device, the antireflective-film attached transparent substrate can suppress the reflection from the interface between the image display device and an adhesive layer. Accordingly, the contrast in bright areas of the image display device can be enhanced. As described later in Examples, the luminous transmittance can be measured by the technique defined in JIS Z 8709 (1999). The luminous transmittance of the antireflective-film attached transparent substrate according to the invention is preferably from 50% to 80%, and more preferably from 65% to 75%.

The antireflective-film attached transparent substrate according to the present invention has a b* value of a transmission color being 5 or lower under a D65 light source. The b* value being in the range specified above can prevent the transmission light from taking on a yellowish tinge. Therefore, the antireflective-film attached transparent substrate is suitable for use as a cover glass of an image display device. As described later in Examples, the b* value of a transmission color under a D65 light source can be measured by the technique defined in JIS Z 8729 (2004). The b* value of the antireflective-film attached transparent substrate according to the present intention is preferably 3 or smaller, and more preferably 2 or smaller.

In the antireflective-film attached transparent substrate according to the present invention, the antireflective film has a luminous reflectance of 1% or lower. The antireflective film having a luminous reflectance within the range specified above can highly achieve an effect of preventing external light from reflecting on a screen of an image display device in the case where the antireflective-film attached transparent substrate is used as a cover glass of the image display device. As described later in Examples, the luminous reflectance can be measured by the technique defined in JIS Z 8701 (1999). The luminous reflectance of the antireflective film in the antireflective-film attached transparent substrate according to the present invention is preferably 0.8% or lower, and more preferably 0.6% or lower.

In the antireflective-film attached transparent substrate according to the present invention, the antireflective film has a sheet resistance of $10^4\Omega/\square$ or higher. The antireflective film having a sheet resistance within the range specified above can achieve an insulating property. Therefore, in the case of being used as a cover glass of an image display device with a touch panel, the antireflective-film attached transparent substrate can retain a capacitance change caused by a finger touch, which is required for a capacitance-type touch sensor, and thus, can allow the touch panel to function. As described later in Examples, the sheet resistance can be measured by the technique defined in ASTM D257 or JIS K 6271-6 (2008). The sheet resistance of the antireflective film in the antireflective-film attached transparent substrate according to the present invention is preferably $10^6\Omega/\square$ or higher, and more preferably $10^8\Omega/\square$ or higher.

The antireflective film in the antireflective-film attached transparent substrate according to one embodiment of the present invention preferably has the following structure.

FIG. 1 is a cross-sectional diagram schematically illustrating one constitutional example of an antireflective-film attached transparent substrate, in which an antireflective film 20 is formed on a transparent substrate 10. The antireflective film 20 illustrated in FIG. 1 has a multilayer structure built up of two layers of a dielectric layer 22 and another dielectric layer 26, which differ from each other in refractive index. Building up of two dielectric layers 22 and 26 differing in refractive index can reduce reflection of light.

The antireflective film 20 illustrated in FIG. 1 may be either a combination of the dielectric layer 22 as a high refractive index layer and the dielectric layer 26 as a low refractive index layer or a combination of the dielectric layer 22 as a low refractive index layer and the dielectric layer 26 as a high refractive index layer. The term "high refractive index layer" refers to a layer having a refractive index of 1.9 or higher at a wavelength of 550 nm, while the term "low refractive index layer" refers to a layer having a refractive index of 1.6 or lower at a wavelength of 550 nm, for example.

In the antireflective film 20 illustrated in FIG. 1, fine particles 24 having light ray absorbency are dispersed into the dielectric layer 22. As the fine particles 24 having light ray absorbency, particles having high light ray absorbency throughout the wavelength range of visible rays are used.

In the present embodiment, fine particles 24 having high light ray absorbency throughout the wavelength range of visible rays is dispersed into the dielectric layer 22. Therefore, transmission light is more effectively prevented from taking on a yellowish tinge.

In the present embodiment, the fine particles 24 to be dispersed into the dielectric layer 22 are fine particles of at least one chemical species selected from the group consisting of Ag, Mo, W, Cu, Au, Pd, Pt, Ir, Ni, Co, Fe, Cr, C, TiC, SiC, TiN, and CrN.

Those chemical species exemplified as the fine particles 24 has high conductivity. However, in contrast to the light absorbing film of the light-absorptive anti-reflector disclosed in Patent Document 1, the fine particles 24 are dispersed into the dielectric layer 22. Therefore, the antireflective film 20 has insulating properties.

Each of the dielectric layers 22 and 26 is preferably constituted mainly of at least one oxide selected from the group consisting of oxides of Si, Nb, Ti, Zr, Ta, Al, Sn, and In or constituted mainly of at least one nitride selected from the group consisting of nitrides of Si and Al. Reasons for such preference are as follows.

The dielectric layers themselves preferably have no light ray absorbency. Therefore, the dielectric layers having small absorbency throughout the visible wavelength region are preferable. In order to form a film having antireflection properties in the case of using a glass substrate as the transparent substrate for example, the low refractive index layer preferably has a refractive index of 1.5 or lower at a wavelength of 550 nm, and the high refractive index layer preferably has a refractive index of 1.8 or higher at a wavelength of 550 nm. Fine particles selected from the groups mentioned above can satisfy such conditions.

In this specification, the word "mainly" indicates that the proportion of the oxide or nitride as recited above is 70% by mass or higher in the constituents of the dielectric layer 22 or 26.

Constituents of the dielectric layers 22 and 26 are selected as appropriate from the oxides or nitrides as recited above so as to achieve layers having the respectively desired refractive index (high refractive index layer and low refractive index layer). Here, constituents of the dielectric layer 22 are selected as appropriate so as to achieve a layer having the desired refractive index (high refractive index layer and low refractive index laye) taking the refractive index of fine particles 24 into account.

Each of the dielectric layers 22 and 26 may contain only one kind of the oxides or nitrides recited above or may contain two or more kinds thereof.

Although the antireflective film 20 illustrated in FIG. 1 is of a multilayer structure with two dielectric layers 22 and 26, the antireflective film in the present invention should not be construed as being limited to such a structure. The antireflective film in the present invention may be a multilayer structure with three or more layers differing from one another in refractive index. In such a case, it is not necessary to make the refractive index of each layer different from that of every other layer. For example, a multilayer structure with three layers can be formed into a triple-layered structure built up of a low refractive index layer, a high refractive index layer and a low refractive index layer, or a triple-layered structure built up of a high refractive index layer, a low refractive index layer and a high refractive index layer. Two low refractive index layers in the former case or two high refractive index layers in the latter case may be the same in refractive index. A multilayer structure with four layers can be formed into a quadruple-layered structure built up of a low refractive index layer, a high refractive index layer, a low refractive index layer and a high refractive index layer, or a quadruple-layered structure built up of a high refractive index layer, a low refractive index layer, a high refractive index layer and a low refractive index layer. Similarly, two low refractive index layers in each case may be the same in refractive index, and two high refractive index layers in each case may be the same in refractive index.

In the antireflective film 20 illustrated in FIG. 1, fine particles 24 are dispersed into the dielectric layer 22. However, fine particles may be dispersed into the dielectric layer 26, or may be dispersed into both the dielectric layer 22 and the dielectric layer 26.

In the cases where the antireflective film has a multilayer structure built up of three or more layers different from one another in refractive index, fine particles may be dispersed into each of two or more layers. For example, in the case of a triple-layered structure built up of a low refractive index layer, a high refractive index layer and a low refractive index layer, fine particles may be dispersed into each of the two low refractive index layers. In the case of a triple-layered structure built up of a high refractive index layer, a low refractive index layer and a high refractive index layer, fine particles may be dispersed into each of the two high refractive index layers. In the case of a quadruple-layered structure built up of a low refractive index layer, a high refractive index layer, a low refractive index layer and a high refractive index layer and in the case of a quadruple-layered structure built up of a high refractive index layer, a low refractive index layer, a high refractive index layer and a low refractive index layer, fine particles may be dispersed into each of the two low refractive index layers in each structure or each of the two high refractive index layers in each structure.

For the following reasons, the fine particles 24 to be dispersed into the dielectric layer 22 are preferably fine particles of at least one chemical species selected from the group consisting of Ag, Mo, W, Cu, Au, Pd, Pt, Ir, Ni, Co, Fe, Cr, C, TiC, SiC, TiN, and CrN.

All of these chemical species have high redox potential, and they are therefore unlikely to react with surrounding oxides to produce oxide particles. In addition, fine particles of such a chemical species have high light ray absorbency, and hence only a small addition of these fine particles conduces to sufficient light ray absorption, which can also reduce the possibility of being agglomerated to generate macroscopic conductivity. Furthermore, they also have an advantage of relatively easy availability.

Fine particles 24 dispersed into the dielectric layer 22 may be either only one or two or more chemical species among the above-recited ones.

In the case where the antireflective film is formed on a principal surface of the transparent substrate in the procedure as described later, fine particles are preferably dispersed into a dielectric layer other than the outermost of the dielectric layers forming the antireflective film.

The dielectric layer 22 into which fine particles 24 are dispersed most affects on the luminous transmittance of the antireflective-film attached transparent substrate and the sheet resistance of the antireflective film among the above-mentioned characteristics of the antireflective-film attached transparent substrate according to the present invention.

In order to achieve the luminous transmittance of the antireflective-film attached transparent substrate being within a range of 20% to 85% and the sheet resistance of the antireflective film being $10^4 \Omega/\square$ or higher, it is appropriate to choose a combination of the dielectric layer 22 and the fine particles 24 dispersing into the dielectric layer 22 so as to satisfy the following conditions.

As for the materials constituting the dielectric layer 22 into which fine particles 24 are dispersed, when a dielectric layer is formed without fine particles 24, the dielectric layer preferably has a sheet resistance of $1 \times 10^8 \Omega/\square$ or higher, and more preferably $1 \times 10^9 \Omega/\square$ or higher.

On the other hand, fine particles 24 as a simple substance preferably have a volume resistance of $1 \times 10^{-5}$ $\Omega$m or lower. As described later in Examples, the sheet resistance can be measured by the technique defined in ASTM D257 or JIS K 6271-6 (2008).

The dielectric layer 22 into which fine particles 24 are dispersed preferably has an extinction coefficient at a wavelength of 550 nm being in a range of 0.005 to 3, and preferably in a range of 0.01 to 1.

The extinction coefficient at a wavelength of 550 nm being lower than 0.005 makes it difficult to achieve a sufficient absorption characteristic with a reasonable thickness, and thus also makes it difficult for the antireflective-film attached transparent substrate to attain the luminous transmittance of 85% or lower. On the other hand, the extinction coefficient at a wavelength of 550 nm being higher than 3 leads to, contrary to the above case, excessively strong absorption and thus, makes it difficult for the antireflective-film attached transparent substrate to attain the luminous transmittance of 20% or higher.

Moreover, the extinction coefficient at a wavelength of 550 nm being in the range specified above can make the transmission light less take on yellowish tinge, and also makes it possible for the antireflective-film attached transparent substrate to have a b* value of a transmission color being 5 or smaller under a D65 light source.

The dielectric layer 26 formed on the dielectric layer 22 satisfying the physical properties mentioned above preferably has a permittivity of from 1.3 to 1.5 and a thickness of from 30 nm to 150 nm.

The antireflective-film attached transparent substrate satisfying the above-mentioned conditions concerning its luminous transmittance and b* value, and the luminous reflectance and sheet resistance of its antireflective film, may have the following constitution, for example.

On one principal surface of a transparent substrate may be formed a traditional antireflective film, and on the other principal surface of the transparent substrate is formed the dielectric layer into which fine particles having light ray absorbency are dispersed.

As the fine particles having light ray absorbency, use can be made of oxides such as chromium oxide and iron oxide, carbides such as chromium carbide and tungsten carbide, carbon black, mica, and the like.

As the dielectric layer into which fine particles having light ray absorbency are to be dispersed, use can be made of layers of resins including homopolymers such as epoxy resin, acrylic resin, polyethylene terephthalate, polyether sulfone, polyarylate, polycarbonate, transparent ABS resin, phenol resin, acrylonitrile-butadiene-styrene resin, polyurethane, polymethyl methacrylate, polyvinyl formal, polyvinyl butyral, polyether ether ketone, polyethylene, polyester, polypropylene, polyamide, and polyimide; copolymers of the monomers forming the above-recited homopolymers and monomers copolymerizable therewith, and the like.

Figure 2:
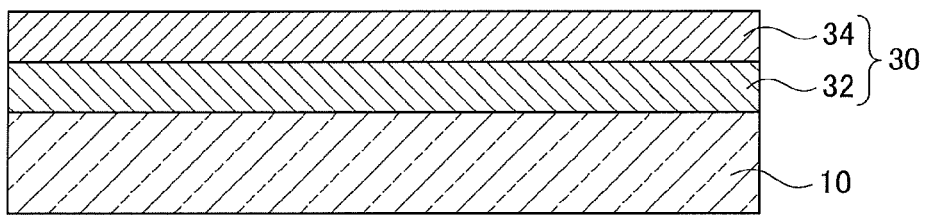
FIG. 2 is a cross-sectional diagram schematically illustrating another constitutional example of a transparent substrate with an antireflective film.

FIG. 2 is a cross-sectional diagram schematically illustrating another constitutional example of an antireflective-film attached transparent substrate, in which an antireflective film 30 is formed on a transparent substrate 10. The antireflective film 30 illustrated in FIG. 2 has a multilayer structure built up of two layers of a layer 32 and another layer 34, differing from each other in refractive index. Building up of the layers 32 and 34 differing in refractive index can reduce reflection of light.

In the antireflective film 30 illustrated in FIG. 2, the layer 32 is constituted mainly of a mixed oxide of at least one oxide selected from the group A consisting of oxides of Mo and W and at least one oxide selected from the group B consisting of oxides of Si, Nb, Ti, Zr, Ta, Al, Sn, and In. Therein, the proportion of the group B oxide content of the mixed oxide to the total content of the group A oxide and the group B oxide in the mixed oxide (hereafter abbreviated as a group B content) is lower than 50% by mass.

The layer 34 is constituted mainly of Si oxide, namely $SiO_2$.

As a light-transmissible film having light absorbency and insulating properties is known a halftone mask used in a semiconductor manufacturing field. As the halftone mask is used an oxygen defect film such as Mo—$SiO_x$ film with a small amount of Mo. In addition, as a light-transmissible film having light ray absorbency and insulating properties is known a narrow band-gap film used in the semiconductor manufacturing field.

However, such films have high light ray absorbency on the short wavelength side of the visible region and thus, make the light transmitted through the films take on a yellowish tinge. Those films are therefore unsuitable for application to the cover glass of an image display device.

In this embodiment of the present invention, it was found that the combination of the layer 32 having an increased Mo content and the layer 34 formed of $SiO_2$ can provide an antireflective-film attached transparent substrate which has light ray absorbency and insulating properties, and imparts no yellowish tinge to the light transmitted through the substrate In the antireflective film 30 illustrated in FIG. 2, the layer 32 is a high refractive index layer and the layer 34 is a low refractive index layer.

In this specification, the word "mainly" indicates that the proportion of the mixed oxide of at least one oxide selected from the group A consisting of oxides of Mo and W and at least one oxide selected from the group B consisting of oxides of Si, Nb, Ti, Zr, Ta, Al, Sn and In is 70% by mass or higher in the constituents of the layer 32, and the proportion of the Si oxide is 70% by mass or higher in the constituents of the layer 34.

Hereinafter, in this specification, the layer constituted mainly of the mixed oxide containing the group A and the group B is described as the (A-B-O) layer, and the layer constituted mainly of the Si oxide is described as the ($SiO_2$) layer.

The antireflective-film attached transparent substrate illustrated in FIG. 2 has an antireflective film 30 having the foregoing constitution and thus, satisfies the characteristics required of the antireflective-film attached transparent substrate according to the present invention.

A reason why the group B content in the (A-B-O) layer 32 be adjusted to lower than 50% by mass is that the group B content being 50% by mass or higher makes the b* value greater than 5. The group B content is preferably 45% by mass or lower, more preferably 40% by mass or lower, and further preferably 35% or lower.

Although the antireflective film 30 illustrated in FIG. 2 is of a multilayer structure with two layers, namely the (A-B-O) layer 32 and the ($SiO_2$) layer 34, the antireflective film in the present invention should not be construed as being limited to such a structure. The antireflective film in the present invention may be a multilayer structure formed by stacking up the ($SiO_2$) layer and the (A-B-O) layer on a transparent substrate in this order, or may be a multilayer structure with three or more layers differing from one another in refractive index. In such a case, at least one layer is the ($SiO_2$) layer and at least one of the other layers is the (A-B-O) layer. For example, a multilayer structure with three layers can be formed into a triple-layered structure that the (A-B-O) layer, the ($SiO_2$) layer and the (A-B-O) layer are stacked up on a transparent substrate in this order, or a triple-layered structure that the ($SiO_2$) layer, the (A-B-O) layer and the ($SiO_2$) layer are stacked up on a transparent substrate in this order. A multilayer structure with four layers can be formed into a quadruple-layered structure that the (A-B-O) layer, the ($SiO_2$) layer, the (A-B-O) layer and the ($SiO_2$) layer are stacked up on a transparent substrate in this order, or a quadruple-layered structure that the ($SiO_2$) layer, the (A-B-O) layer, the ($SiO_2$) layer and the (A-B-O) layer are stacked up on a transparent substrate in this order.

In other cases of a multilayer structure built up of three or more layers differing from one other in refractive index, a layer or layers other than the (A-B-O) layer and the ($SiO_2$) layer may be included. In such cases, it is necessary to choose each structural layer with taking into consideration that the (A-B-O) layer and the ($SiO_2$) layer are included, so as to be a triple-layered structure built up of a low refractive index layer, a high refractive index layer and a low refractive index layer, a triple-layered structure built up of a high refractive index layer, a low refractive index layer and a high refractive index layer, a quadruple-layered structure built up of a low refractive index layer, a high refractive index layer, a low refractive index layer and a high refractive index layer, a quadruple-layered structure built up of a high refractive index layer, a low refractive index layer, a high refractive index layer and a low refractive index layer, or the like. Therein, however, the outermost layer is preferably the ($SiO_2$) layer. This is because a low reflectivity can be easily achieved by forming the outermost layer by the ($SiO_2$) layer. In the case of forming an antifouling film, the film is preferably formed on the ($SiO_2$) layer from the viewpoint of binding properties associated with the ability of the film.

The antireflective-film attached transparent substrate accordurding to the present invention is described below in further detail.

(Transparent Substrate)

The transparent substrate is preferably formed of a material having a refractive index of 1.4 to 1.7. This is because, when the transparent substrate is bonded optically to a display or a touch panel, reflection from the bonding interface can be sufficiently reduced.

As mentioned above, the transparent substrate is preferably a glass substrate. As the glass substrate, glass having various compositions can be utilized. For example, the glass usable in the present invention preferably contains sodium and preferably has a composition which allows molding and strengthening by a chemical strengthening treatment. Examples of such glass include aluminosilicate glass, soda-lime glass, borosilicate glass, lead glass, alkali-barium glass, and aluminoborosilicate glass.

The thickness of the glass substrate is not particularly limited. However, in order to effectively carry out a chemical strengthening treatment, it is generally adjusted to 5 mm or thinner, and preferably 3 mm or thinner.

A preferred glass substrate is a chemically strengthened glass having undergone chemical strengthening for the purpose of heightening the strength of cover glass. In the case where antiglare treatment is given to the glass substrate, chemical strengthening is carried out after antiglare treatment but before the formation of an antireflective film.

As to the glass substrate, the principal surface on the side where an antireflective film is to be formed preferably undergoes an antiglare treatment. The method of antiglare treatment is not particularly limited, and use can be made of a method of giving surface treatment to a principal surface of the glass substrate to form desired asperities. Specific examples thereof include a method of giving a chemical treatment, such as frost treatment, to a principal surface of a glass substrate. In the frost treatment, the glass substrate as a material to be treated is immersed in, for example, a mixed solution of hydrogen fluoride and ammonium fluoride, whereby the immersed surface can undergo surface treatment chemically. Other antiglare treatment than the chemical treatment can be utilized. Examples thereof include a so-called sand blast treatment in which crystalline silicon dioxide powder, silicon carbide powder or the like is blown on the glass substrate surface with the aid of compressed air, and a physical treatment in which the glass substrate surface is polished with a brush which is with crystalline silicon dioxide powder, silicon carbide powder or the like and wetted with water.

(Antireflective Film)

The antireflective film as mentioned above can be formed on a principal surface of the transparent substrate by using a known film-forming method, such as a sputtering method. More specifically, dielectric layers or layers to constitute the antireflective film are formed in sequence on a principal surface of the transparent substrate in order of stacking by using a known film-forming method, such as a sputtering method.

A dielectric layer into which fine particles are dispersed can be formed in the following procedure.

First, a dielectric material to constitute a matrix is sputtered so as to form a film having a thickness of several nm, whereby a continuous film of the dielectric as the oxide or nitride of the dielectric material is formed.

Next, a material for fine particles is sputtered to such an extent that the film formed is not a continuous film. The wording "an extent that the film formed is not a continuous film" refers to the thickness of a discontinuous film formed by sputtering. The thickness at which a discontinuous film is formed depends on the material of fine particles, and it is chosen as appropriate according to a material selected for the fine particles.

Then, under plasma discharge of an inert gas only, such as argon, into which neither oxygen nor nitrogen is introduced, the dielectric material to constitute the matrix is sputtered to form a film having a thickness of the order of 1 nm. This film is a sacrificial layer for prevention of oxidizing or nitriding of the discontinuous film, which has been formed in the precedent step, at the next step of forming the dielectric film by sputtering.

Next, the dielectric material to constitute the matrix is sputtered to form a film having a thickness of several nm, to thereby form a continuous film of the dielectric as oxide or nitride of the dielectric material.

In this manner, the film containing fine particles in a state of being dispersed into a dielectric as the matrix can be formed.

Repetition of the procedure as mention above can provide the dielectric layer having any thickness.

The foregoing procedure can be done with ease by using a digital sputtering method.

The digital sputtering method is different from a usual magnetron sputtering method. In the digital sputtering method, to begin with, a very thin film of a metallic material is formed by sputtering, and then the film is oxidized by irradiation with oxygen plasma, oxygen ions or oxygen radicals. In the digital sputtering method, these processes are repeated in the same chamber, thereby forming a thin film of metal oxide.

According to this method, the dielectric layer in which fine particles are dispersed can be formed with ease in the following manner. That is, a target for fine particles, a metal target for a dielectric to form a matrix and an oxygen plasma source are disposed in passing order of the transparent substrate, and after the metal for the dielectric as the matrix is made to deposit on the fine particles, the input of power into oxygen plasma and the film thickness of a deposit of the dielectric matrix are adjusted to an extent that the metal for the dielectric of the matrix is just oxidized with an oxygen plasma source.

Also in the case of using a passage-type in-line sputtering apparatus, some contrivances such as subdivision of the target itself, allows formation of a dielectric layer in which fine particles are dispersed.

The antireflective film has no particular limitation as to the material thereof, and various materials can be utilized as long as they can suppress reflection of light. For example, the antireflective film may have a structure built up of a high refractive index layer and a low refractive index layer. The term "high refractive index layer" as used herein refers to a layer having a refractive index of 1.9 or higher at a wavelength of 550 nm, and the term "low refractive index layer"

as used herein refers to a layer having a refractive index of 1.6 or lower at a wavelength of 550 nm.

Additionally, the antireflective-film attached transparent substrate according to the present invention may have a structure that the antireflective film is provided on only one of the principal surfaces of the transparent substrate, but when required, the antireflective film may be provided on both the principal surfaces of the transparent substrate.

(Antifouling Film)

The antireflective-film attached transparent substrate according to the present invention may further have an antifouling film (also referred to as "Anti Finger Print (AFP) film") on the antireflective film from the viewpoint of protecting the outermost surface of the antireflective film. The antifouling film can be constituted of, for example, a fluorine-containing organosilicon compound. Any of fluorine-containing organosilicon compounds can be used without particular limitations as far as they can impart antifouling properties, water repellency and oil repellency. Examples of such a fluorine-containing organosilicon compound include fluorine-containing organosilicon compounds each having at least one group selected from the group consisting of polyfluoropolyether groups, polyfluoroalkylene groups and polyfluoroalkyl groups. Here, the term "polyfluoropolyether groups" refer to divalent groups each having a structure with alternating a polyfluoroalkylene group and an etheric oxygen atom.

As commercially available fluorine-containing organosilicon compounds each having at least one group selected from the group consisting of polyufluoropolyether groups, polyfluoroalkylene groups and polyfluoroalkyl groups, use can be preferably made of KP-801 (trade name, a product of Shin-Etsu Chemical Co., Ltd.), KY-178 (trade name, a product of Shin-Etsu Chemical Co., Ltd.), KY-130 (trade name, a product of Shin-Etsu Chemical Co., Ltd.), KY-185 (trade name, a product of Shin-Etsu Chemical Co., Ltd.), OPTOOL (trademark) DSX and OPTOOL AES (which are trade names, products of DAIKIN INDUSTRIES, LTD.), and the like.

Such an antifouling film is laminated on an antireflective film. In the case where an antireflective film is formed on each side of the glass substrate, the antifouling film can be formed on each of the antireflective films, or may be formed on only one of the antireflective films. This is because the antifouling film should be provided at the site having a possibility for contact with human fingers and the like. The siting of the antifouling film can be chosen in response to its uses and the like.

EXAMPLES

The present invention will now be described more specifically, referring to the following Examples, but the present invention should not be construed as being limited to these Examples.

Example 1

An antireflective-film attached transparent substrate was prepared by forming an antireflective film on one of the principal surfaces of a transparent substrate in the following manner.

As the transparent substrate was used a chemically strengthened glass substrate with dimensions of 50 mm long, 50 mm wide and 2 mm thick (Dragontrail, trademark, a product of Asahi Glass Co., Ltd.).

Next, an antireflective film having the following multilayer structure was formed on one of the principal surfaces of the glass substrate by using a usual sputtering method. Here, the term "usual sputtering method" refers to the technique for forming a dielectric layer in which fine particles are dispersed, by using a magnetron sputtering method in the procedure described in the section of "Antireflective Film" described above. The obtained antireflective film of the multilayer structure had the following constituent layers which were stacked one after another on one principal surface side of the transparent substrate.

Dielectric layer (1): Ag-fine-particles dispersed $SiO_2$ layer (thickness: 20 nm)
Dielectric layer (2): $TiO_2$ layer (thickness: 25 nm)
Dielectric layer (3): $SiO_2$ layer (thickness: 120 nm)
Characteristic values of these layers were as follows.
Refractive index of each layer at wavelength of 550 nm
Dielectric layer (1): 1.55
Dielectric layer (2): 2.35
Dielectric layer (3): 1.47
Sheet resistance of $SiO_2$ layer which was formed in the same manner as in dielectric layer (1) without dispersing Ag fine particles: $10^{10} \Omega/\square$ or higher
Extinction coefficient of dielectric layer (1) at wavelength of 550 nm: 0.36

On the thus prepared antireflective film-attached transparent substrate was carried out the following evaluations.

(Sheet Resistance of Antireflective Film)

Sheet resistance was measured by using a measuring device (made by Mitsubishi Chemical Analytech Co., Ltd., device name: Hiresta UP (model MCP-HT450)). The probe was applied to the center of the antireflective-film attached transparent substrate, and measurement was made by 10-second passage of electric current under a voltage of 10 V.

(Luminous Reflectance of Antireflective Film)

Spectral reflectance was measured by using a spectrophotometer (made by Shimadzu Corporation, trade name: SolidSpec-3700), and the luminous reflectance (the stimulus value Y of reflection, defined in JIS Z 8701: 1999) was determined by calculation. Here, the measurement was carried out in a condition that the back side of the antireflective-film attached transparent substrate (the side of the glass substrate) was coated with black lacquer to eliminate back reflection.

(Luminous Transmittance of Antireflective-Film Attached Transparent Substrate)

Spectral transmittance was measured by using a spectrophotometer (made by Shimadzu Corporation, trade name: SolidSpec-3700), and the luminous transmittance (the stimulus value Y defined in JIS Z 8701: 1999) was determined by calculation. (Transmission Color (b* value) of Antireflective-Film Attached Transparent Substrate under D65 Light Source)

From the transmission spectrum obtained by the above-mentioned spectral transmittance measurement, the color index (b* value) defined in JIS Z 8729: 2004 was determined. The light source used was a D65 light source.

Results obtained are shown below in Table 1.

Example 2

An antireflective-film attached transparent substrate was prepared in the same manner as in Example 1, except that the antireflective film of a multilayer structure had the following constituent layers.

Dielectric layer (1): Cu-fine-particles dispersed SiO$_2$ layer (thickness: 80 nm)
Dielectric layer (2): SiO$_2$ layer (thickness: 40 nm)
Characteristic values of these layers were as follows.
Refractive index of each layer at wavelength of 550 nm
Dielectric layer (1): 1.42
Dielectric layer (2): 1.47
Sheet resistance of SiO$_2$ layer which was formed in the same manner as in dielectric layer (1) without dispersing Cu fine particles: $10^{10}\Omega/\square$ or higher
Extinction coefficient of dielectric layer (1) at wavelength of 550 nm: 0.17
The evaluations as described above were carried out on the thus prepared antireflective-film attached transparent substrate. The results obtained are shown below in Table 1.

Example 3

An antireflective-film attached transparent substrate was prepared in the same manner as in Example 1, except that the dielectric layers were formed by using a digital sputtering method and the antireflective film of a multilayer structure had the following constituent layers.
Dielectric layer (1): Ag-fine-particles dispersed TiO$_2$ layer (thickness: 22 nm)
Dielectric layer (2): SiO$_2$ layer (thickness: 105 nm)
Characteristic values of these layers were as follows.
Refractive index of each layer at wavelength of 550 nm
Dielectric layer (1): 2.03
Dielectric layer (2): 1.47
Sheet resistance of TiO$_2$ layer which was formed in the same manner as in dielectric layer (1) without dispersing Ag fine particles: $5\times10^9\Omega/\square$
Extinction coefficient of dielectric layer (1) at wavelength of 550 nm: 0.34
The evaluations as described above were carried out on the thus prepared antireflective-film attached transparent substrate. The results obtained are shown below in Table 1.

Example 4

An antireflective-film attached transparent substrate was prepared in the same manner as in Example 1, except that the antireflective film of a multilayer structure had the following constituent layers.
Dielectric layer (1): Mo-fine-particles dispersed SiO$_2$ layer (thickness: 30 nm)
Dielectric layer (2): SiO$_2$ layer (thickness: 100 nm)
Characteristic values of these layers were as follows.
Refractive index of each layer at wavelength of 550 nm
Dielectric layer (1): 1.82
Dielectric layer (2): 1.47
Sheet resistance of SiO$_2$ layer which was formed in the same manner as in dielectric layer (1) without dispersing Mo fine particles: $10^{10}\Omega/\square$ or higher
Extinction coefficient of dielectric layer (1) at wavelength of 550 nm: 0.38
The evaluations as described above were carried out on the thus prepared antireflective-film attached transparent substrate. The results obtained are shown below in Table 2.

Example 5

An antireflective-film attached transparent substrate was prepared in the same manner as in Example 1, except that the antireflective film of a multilayer structure had the following constituent layers.

Dielectric layer (1): Ag-fine-particles dispersed Nb$_2$O$_5$ layer (thickness: 13 nm)
Dielectric layer (2): SiO$_2$ layer (thickness: 26 nm)
Dielectric layer (3): Nb$_2$O$_5$ layer (thickness: 100 nm)
Dielectric layer (4): SiO$_2$ layer (thickness: 95 nm)
Characteristic values of these layers were as follows.
Refractive index of each layer at wavelength of 550 nm
Dielectric layer (1): 2.38
Dielectric layer (2): 1.47
Dielectric layer (3): 2.38
Dielectric layer (4): 1.47
Sheet resistance of Nb$_2$O$_5$ layer which was formed in the same manner as in dielectric layer (1) without dispersing Ag fine particles: $3\times10^9\Omega/\square$
Extinction coefficient of dielectric layer (1) at wavelength of 550 nm: 0.076
The evaluations as described above were carried out on the thus prepared antireflective-film attached transparent substrate. The results obtained are shown below in Table 2.

Example 6

An antireflective-film attached transparent substrate was prepared in the same manner as in Example 1, except that the dielectric layers were formed by using a digital sputtering method and the antireflective film of a multilayer structure had the following constituent layers.
Dielectric layer (1): Ag-fine-particles dispersed Nb$_2$O$_5$ layer (thickness: 25 nm)
Dielectric layer (2): SiO$_2$ layer (thickness: 30 nm)
Dielectric layer (3): Ag-fine-particles dispersed Nb$_2$O$_5$ layer (thickness: 125 nm)
Dielectric layer (4): SiO$_2$ layer (thickness: 95 nm)
Characteristic values of these layers were as follows.
Refractive index of each layer at wavelength of 550 nm
Dielectric layer (1): 2.38
Dielectric layer (2): 1.47
Dielectric layer (3): 2.38
Dielectric layer (4): 1.47
Sheet resistances of Nb$_2$O$_5$ layers which were formed in the same manner as in dielectric layers (1) and (3) without dispersing Ag fine particles: both $3\times10^9\Omega/\square$
Extinction coefficients of dielectric layers (1) and (3) at wavelength of 550 nm: both 0.076
The evaluations as described above were carried out on the thus prepared antireflective-film attached transparent substrate. The results obtained are shown below in Table 2.

Example 7

An antireflective-film attached transparent substrate was prepared in the same manner as in Example 1, except that the antireflective film of a multilayer structure had the following constituent layers.
Dielectric layer (1): Ag-fine-particles dispersed SiN layer (thickness: 25 nm)
Dielectric layer (2): SiO$_2$ layer (thickness: 90 nm)
Characteristic values of these layers were as follows.
Refractive index of each layer at wavelength of 550 nm
Dielectric layer (1): 1.99
Dielectric layer (2): 1.47
Extinction coefficient of dielectric layer (1) at wavelength of 550 nm: 0.88
The evaluations as described above were carried out on the thus prepared antireflective-film attached transparent substrate. The results obtained are shown below in Table 3.

Example 8

An antireflective-film attached transparent substrate was prepared in the same manner as in Example 1, except that the dielectric layers were formed by using a digital sputtering method and the antireflective film of a multilayer structure had the following constituent layers.

Dielectric layer (1): $Nb_2O_5$ layer (thickness: 8 nm)
Dielectric layer (2): Ag-fine-particles-with 1 wt % Pd dispersed $SiO_2$ layer (thickness: 25 nm)
Dielectric layer (3): $Nb_2O_5$ layer (thickness: 112 nm)
Dielectric layer (4): $SiO_2$ layer (thickness: 90 nm)
Characteristic values of these layers were as follows.
Refractive index of each layer at wavelength of 550 nm
Dielectric layer (1): 2.38
Dielectric layer (2): 1.55
Dielectric layer (3): 2.38
Dielectric layer (4): 1.47
Sheet resistance of $SiO_2$ layer which was formed in the same manner as in dielectric layer (2) without dispersing Ag fine particles containing 1 wt % of Pd: $10^{10}$ Ω/□ or higher
Extinction coefficient of dielectric layer (2) at wavelength of 550 nm: 0.36
The evaluations as described above were carried out on the thus prepared antireflective-film attached transparent substrate. The results obtained are shown below in Table 3.

Example 9

An antireflective-film attached transparent substrate was prepared by forming an antireflective film on one of the principal surfaces of a transparent substrate in the following manner.

First, while a gas mixture prepared by mixing 10% by volume of oxygen gas with argon gas was introduced and a pressure of 0.3 Pa was maintained, silicon and molybdenum were co-sputtered by using a silicon target and a molybdenum target, thereby forming a Mo—Si—O layer in the form of film having a thickness of 14 nm on one of the principal surfaces of a transparent substrate. The silicon target was subjected to a pulse sputtering with a pulse width of 5 μsec under conditions of a frequency of 20 kHz, a power density of 0.6 W/cm² and an inversion pulse width of 5 μse. The molybdenum target was subjected to a pulse sputtering with a pulse width of 5 μsec under conditions of a frequency of 20 kHz, a power density of 4.0 W/cm² and an inversion pulse width of 5 μsec.

Next, while a gas mixture prepared by mixing 40% by volume of oxygen gas with argon gas was introduced, pulse sputtering with a pulse width of 5 μsec was carried out by using a silicon target under conditions of a pressure of 0.3 Pa, a frequency of 20 kHz, a power density of 3.8 W/cm² and an inversion pulse width of 5 μsec, thereby forming a layer of silicon oxide (silica ($SiO_2$)) in the form of film having a thickness of 35 nm.

Then, while a gas mixture prepared by mixing 10% by volume of oxygen gas with argon gas was introduced and a pressure of 0.3 Pa was maintained, silicon and molybdenum were co-sputtered by using a silicon target and a molybdenum target, thereby forming a Mo—Si—O layer in the form of film having a thickness of 120 nm. The silicon target was subjected to a pulse sputtering with a pulse width of 5 μsec under conditions of a frequency of 20 kHz, a power density of 0.6 W/cm² and an inversion pulse width of 5 μse. The molybdenum target was subjected to a pulse sputtering with a pulse width of 5 μsec under conditions of a frequency of 20 kHz, a power density of 4.0 W/cm² and an inversion pulse width of 5 μsec.

Subsequently thereto, while a gas mixture prepared by mixing 40% by volume of oxygen gas with argon gas was introduced, pulse sputtering with a pulse width of 5 μsec was carried out by using a silicon target under conditions of a pressure of 0.3 Pa, a frequency of 20 kHz, a power density of 3.8 W/cm² and an inversion pulse width of 5 μsec, thereby forming a layer of silicon oxide (silica ($SiO_2$)) in the form of film having a thickness of 90 nm.

The obtained antireflective film of the multilayer structure had the following constituent layers which were stacked one after another on one principal surface side of the transparent substrate.

Dielectric layer (1): Mo—Si—O layer (thickness: 14 nm)
Dielectric layer (2): $SiO_2$ layer (thickness: 35 nm)
Dielectric layer (3): Mo—Si—O layer (thickness: 120 nm)
Dielectric layer (4): $SiO_2$ layer (thickness: 90 nm)

From the analysis by XPS, the compositional ratio between Mo and Si in each of Mo—Si—O layers of the dielectric layers (1) and (3), namely Mo:Si, was found to be 99:1 (wt %). Each of these Mo—Si—O layers had a refractive index at a wavelength of 550 nm being 2.1 and an extinction coefficient at a wavelength of 550 nm being 0.08.

The evaluations as described above were carried out on the thus prepared antireflective-film attached transparent substrate. The results obtained are shown below in Table 5.

Example 10

An antireflective-film attached transparent substrate was prepared by forming an antireflective film on one of the principal surfaces of a transparent substrate in the following manner.

First, while a gas mixture prepared by mixing 15% by volume of oxygen gas with argon gas was introduced and a pressure of 0.3 Pa was maintained, silicon and molybdenum were co-sputtered by using a silicon target and a molybdenum target, thereby forming a Mo—Si—O layer in the form of film having a thickness of 14 nm on one of the principal surfaces of a transparent substrate. The silicon target was subjected to a pulse sputtering with a pulse width of 5 μsec under conditions of a frequency of 20 kHz, a power density of 1.6 W/cm² and an inversion pulse width of 5 μse. The molybdenum target was subjected to a pulse sputtering with a pulse width of 5 μsec under conditions of a frequency of 20 kHz, a power density of 4.0 W/cm² and an inversion pulse width of 5 μsec.

Next, while a gas mixture prepared by mixing 40% by volume of oxygen gas with argon gas was introduced, pulse sputtering with a pulse width of 5 μsec was carried out by using a silicon target under conditions of a pressure of 0.3 Pa, a frequency of 20 kHz, a power density of 3.8 W/cm² and an inversion pulse width of 5 μsec, thereby forming a layer of silicon oxide (silica ($SiO_2$)) in the form of film having a thickness of 35 nm.

Then, while a gas mixture prepared by mixing 15% by volume of oxygen gas with argon gas was introduced and a pressure of 0.3 Pa was maintained, silicon and molybdenum were co-sputtered by using a silicon target and a molybdenum target, thereby forming a Mo—Si—O layer in the form of film having a thickness of 120 nm. The silicon target was subjected to a pulse sputtering with a pulse width of 5 μsec under conditions of a frequency of 20 kHz, a power density of 1.6 W/cm² and an inversion pulse width of 5 μse. The molybdenum target was subjected to a pulse sputtering with a pulse width of 5 μsec under conditions of a frequency of 20 kHz, a power density of 4.0 W/cm² and an inversion pulse width of 5 μsec.

Subsequently thereto, while a gas mixture prepared by mixing 40% by volume of oxygen gas with argon gas was introduced, pulse sputtering with a pulse width of 5 μsec was carried out by using a silicon target under conditions of a pressure of 0.3 Pa, a frequency of 20 kHz, a power density of 3.8 W/cm² and an inversion pulse width of 5 μsec, thereby forming a layer of silicon oxide (silica ($SiO_2$)) in the form of film having a thickness of 90 nm.

The obtained antireflective film of the multilayer structure had the following constituent layers which were stacked one after another on one principal surface side of the transparent substrate.

Dielectric layer (1): Mo—Si—O layer (thickness: 14 nm)
Dielectric layer (2): $SiO_2$ layer (thickness: 35 nm)
Dielectric layer (3): Mo—Si—O layer (thickness: 120 nm)
Dielectric layer (4): $SiO_2$ layer (thickness: 90 nm)

From the analysis by XPS, the compositional ratio between Mo and Si in each of Mo—Si—O layers of the dielectric layers (1) and (3), namely Mo:Si, was found to be 90:10 (wt %). Each of these Mo—Si—O layers had a refractive index at a wavelength of 550 nm being 1.9 and an extinction coefficient at a wavelength of 550 nm being 0.08.

The evaluations as described above were carried out on the thus prepared antireflective-film attached transparent substrate. The results obtained are shown below in Table 5.

Example 11

An antireflective-film attached transparent substrate was prepared by forming an antireflective film on one of the principal surfaces of a transparent substrate in the following manner.

First, while a gas mixture prepared by mixing 39% by volume of oxygen gas with argon gas was introduced and a pressure of 0.3 Pa was maintained, sputtering was performed by using a target that had been obtained by sintering a mixture of niobium and molybdenum (weight ratio Nb/Mo=80/20), thereby forming a Mo—Nb—O layer in the form of film having a thickness of 14 nm on one of the principal surfaces of a transparent substrate. The target was subjected to a pulse sputtering under conditions of a frequency of 20 kHz, a power density of 4.0 W/cm² and an inversion pulse width of 5 μse.

Next, while a gas mixture prepared by mixing 40% by volume of oxygen gas with argon gas was introduced, pulse sputtering with a pulse width of 5 μsec was carried out by using a silicon target under conditions of a pressure of 0.3 Pa, a frequency of 20 kHz, a power density of 3.8 W/cm² and an inversion pulse width of 5 μsec, thereby forming a layer of silicon oxide (silica ($SiO_2$)) in the form of film having a thickness of 35 nm.

Then, while a gas mixture prepared by mixing 10% by volume of oxygen gas with argon gas was introduced and a pressure of 0.3 Pa was maintained, sputtering was performed by using a target that had been obtained by sintering a mixture of niobium and molybdenum (weight ratio Nb/Mo=80/20), thereby forming a Mo—Nb—O layer in the form of film having a thickness of 120 nm. The target was subjected to a pulse sputtering under conditions of a frequency of 20 kHz, a power density of 4.0 W/cm² and an inversion pulse width of 5 μse.

Subsequently thereto, while a gas mixture prepared by mixing 39% by volume of oxygen gas with argon gas was introduced, pulse sputtering with a pulse width of 5 μsec was carried out by using a silicon target under conditions of a pressure of 0.3 Pa, a frequency of 20 kHz, a power density of 3.8 W/cm² and an inversion pulse width of 5 μsec, thereby forming a layer of silicon oxide (silica ($SiO_2$)) in the form of film having a thickness of 90 nm.

The obtained antireflective film of the multilayer structure had the following constituent layers which were stacked one after another on one principal surface side of the transparent substrate.

Dielectric layer (1): Mo—Nb—O layer (thickness: 14 nm)
Dielectric layer (2): $SiO_2$ layer (thickness: 35 nm)
Dielectric layer (3): Mo—Nb—O layer (thickness: 120 nm)
Dielectric layer (4): $SiO_2$ layer (thickness: 90 nm)

From the analysis by XPS, the compositional ratio between Mo and Nb in each of Mo—Nb—O layers of the dielectric layers (1) and (3), namely Mo:Nb, was found to be 80:20 (wt %). Each of these Mo—Nb—O layers had a refractive index at a wavelength of 550 nm being 2.1 and an extinction coefficient at a wavelength of 550 nm being 0.04.

The evaluations as described above were carried out on the thus prepared antireflective-film attached transparent substrate. The results obtained are shown below in Table 6.

Example 12

An antireflective-film attached transparent substrate was prepared by forming an antireflective film on one of the principal surfaces of a transparent substrate in the following manner.

First, while a gas mixture prepared by mixing 39% by volume of oxygen gas with argon gas was introduced and a pressure of 0.3 Pa was maintained, sputtering was performed by using a target that had been obtained by sintering a mixture of niobium and molybdenum (weight ratio Nb/Mo=50/50), thereby forming a Mo—Nb—O layer in the form of film having a thickness of 14 nm on one of the principal surfaces of a transparent substrate. The target was subjected to a pulse sputtering under conditions of a frequency of 20 kHz, a power density of 4.0 W/cm² and an inversion pulse width of 5 μse.

Next, while a gas mixture prepared by mixing 40% by volume of oxygen gas with argon gas was introduced, pulse sputtering with a pulse width of 5 μsec was carried out by using a silicon target under conditions of a pressure of 0.3 Pa, a frequency of 20 kHz, a power density of 3.8 W/cm² and an inversion pulse width of 5 μsec, thereby forming a layer of silicon oxide (silica ($SiO_2$)) in the form of film having a thickness of 35 nm.

Then, while a gas mixture prepared by mixing 39% by volume of oxygen gas with argon gas was introduced and a pressure of 0.3 Pa was maintained, sputtering was performed by using a target that had been obtained by sintering a mixture of niobium and molybdenum (weight ratio Nb/Mo=50/50), thereby forming a Mo—Nb—O layer in the form of film having a thickness of 110 nm. The target was subjected to a pulse sputtering under conditions of a frequency of 20 kHz, a power density of 4.0 W/cm² and an inversion pulse width of 5 μse.

Subsequently thereto, while a gas mixture prepared by mixing 40% by volume of oxygen gas with argon gas was introduced, pulse sputtering with a pulse width of 5 μsec was carried out by using a silicon target under conditions of a pressure of 0.3 Pa, a frequency of 20 kHz, a power density of 3.8 W/cm² and an inversion pulse width of 5 μsec, thereby forming a layer of silicon oxide (silica ($SiO_2$)) in the form of film having a thickness of 90 nm.

The obtained antireflective film of the multilayer structure had the following constituent layers which were stacked one after another on one principal surface side of the transparent substrate.

Dielectric layer (1): Mo—Nb—O layer (thickness: 14 nm)
Dielectric layer (2): $SiO_2$ layer (thickness: 35 nm)
Dielectric layer (3): Mo—Nb—O layer (thickness: 110 nm)
Dielectric layer (4): $SiO_2$ layer (thickness: 90 nm)

From the analysis by XPS, the compositional ratio between Mo and Nb in each of Mo—Nb—O layers of the dielectric layers (1) and (3), namely Mo:Nb, was found to be 50:50 (wt %). Each of these Mo—Nb—O layers had a refractive index at a wavelength of 550 nm being 2.2 and an extinction coefficient at a wavelength of 550 nm being 0.12.

The evaluations as described above were carried out on the thus prepared antireflective-film attached transparent substrate. The results obtained are shown below in Table 6.

Example 13

An antireflective-film attached transparent substrate was prepared by forming an antireflective film on one of the principal surfaces of a transparent substrate in the following manner.

First, while a gas mixture prepared by mixing 10% by volume of oxygen gas with argon gas was introduced and a pressure of 0.3 Pa was maintained, titanium and molybdenum were co-sputtered by using a titanium target and a molybdenum target, thereby forming a Mo—Ti—O layer in the form of film having a thickness of 12 nm on one of the principal surfaces of a transparent substrate. The titanium target was subjected to a pulse sputtering with a pulse width of 5 μsec under conditions of a frequency of 20 kHz, a power density of 1.0 W/cm² and an inversion pulse width of 5 μse. The molybdenum target was subjected to a pulse sputtering with a pulse width of 5 μsec under conditions of a frequency of 20 kHz, a power density of 4.0 W/cm² and an inversion pulse width of 5 μsec.

Next, while a gas mixture prepared by mixing 40% by volume of oxygen gas with argon gas was introduced, pulse sputtering with a pulse width of 5 μsec was carried out by using a silicon target under conditions of a pressure of 0.3 Pa, a frequency of 20 kHz, a power density of 3.8 W/cm² and an inversion pulse width of 5 μsec, thereby forming a layer of silicon oxide (silica ($SiO_2$)) in the form of film having a thickness of 30 nm.

Then, while a gas mixture prepared by mixing 10% by volume of oxygen gas with argon gas was introduced and a pressure of 0.3 Pa was maintained, titanium and molybdenum were co-sputtered by using a titanium target and a molybdenum target, thereby forming a Mo—Ti—O layer in the form of film having a thickness of 106 nm. The titanium target was subjected to a pulse sputtering with a pulse width of 5 μsec under conditions of a frequency of 20 kHz, a power density of 1.0 W/cm² and an inversion pulse width of 5 μse. The molybdenum target was subjected to a pulse sputtering with a pulse width of 5 μsec under conditions of a frequency of 20 kHz, a power density of 4.0 W/cm² and an inversion pulse width of 5 μsec.

Subsequently thereto, while a gas mixture prepared by mixing 40% by volume of oxygen gas with argon gas was introduced, pulse sputtering with a pulse width of 5 μsec was carried out by using a silicon target under conditions of a pressure of 0.3 Pa, a frequency of 20 kHz, a power density of 3.8 W/cm² and an inversion pulse width of 5 μsec, thereby forming a layer of silicon oxide (silica ($SiO_2$)) in the form of film having a thickness of 80 nm.

The obtained antireflective film of the multilayer structure had the following constituent layers which were stacked one after another on one principal surface side of the transparent substrate.

Dielectric layer (1): Mo—Ti—O layer (thickness: 12 nm)
Dielectric layer (2): $SiO_2$ layer (thickness: 30 nm)
Dielectric layer (3): Mo—Ti—O layer (thickness: 106 nm)
Dielectric layer (4): $SiO_2$ layer (thickness: 80 nm)

From the analysis by XPS, the compositional ratio between Mo and Ti in each of Mo—Ti—O layers of the dielectric layers (1) and (3), namely Mo:Ti, was found to be 93:7 (wt %). Each of these Mo—Ti—O layers had a refractive index at a wavelength of 550 nm being 2.1 and an extinction coefficient at a wavelength of 550 nm being 0.06.

The evaluations as described above were carried out on the thus prepared antireflective-film attached transparent substrate. The results obtained are shown below in Table 7.

Comparative Example 1

An antireflective-film attached transparent substrate was prepared in the same manner as in Example 1, except that the antireflective film of a multilayer structure had the following constituent layers.

Dielectric layer (1): CuO layer (thickness: 10 nm)
Dielectric layer (2): $SiO_2$ layer (thickness: 45 nm)
Dielectric layer (3): CuO layer (thickness: 15 nm)
Dielectric layer (4): $SiO_2$ layer (thickness: 100 nm)
Characteristic values were as follows.
Refractive index of each layer at wavelength of 550 nm
Dielectric layer (1): 2.82
Dielectric layer (2): 1.47
Dielectric layer (3): 2.82
Dielectric layer (4): 1.47

The evaluations as described above were carried out on the thus prepared antireflective-film attached transparent substrate. The results obtained are shown below in Table 4.

Comparative Example 2

An antireflective-film attached transparent substrate was prepared in the same manner as in Example 1, except that the antireflective film of a multilayer structure had the following constituent layers.

Dielectric layer (1): TiN layer (thickness: 10 nm)
Dielectric layer (2): $SiO_2$ layer (thickness: 80 nm)
Refractive index of dielectric layer (1) at wavelength of 550 nm: 1.55
Extinction coefficient of dielectric layer (1) at wavelength of 550 nm: 1.32

The evaluations as described above were carried out on the thus prepared antireflective-film attached transparent substrate. The results obtained are shown below in Table 4.

Comparative Example 3

An antireflective-film attached transparent substrate was prepared in the same manner as in Example 1, except that the antireflective film had as its dielectric layer a single film formed of Ag-fine-particles dispersed $SiO_2$ layer (thickness: 100 nm).

Characteristic values were as follows.
Refractive index at wavelength of 550 nm: 1.55
Sheet resistance of $SiO_2$ layer which was formed in the same manner as in the dielectric layer without dispersing Ag fine particles: $10^{10}\Omega/\square$ or higher
Extinction coefficient of Ag-fine-particles dispersed $SiO_2$ layer at wavelength of 550 nm: 0.36
The evaluations as described above were carried out on the thus prepared antireflective-film attached transparent substrate. The results obtained are shown below in Table 4.

Comparative Example 4

An antireflective-film attached transparent substrate was prepared by forming an antireflective film on one of the principal surfaces of a transparent substrate in the following manner.

First, while a gas mixture prepared by mixing 10% by volume of oxygen gas with argon gas was introduced and a pressure of 0.3 Pa was maintained, silicon and molybdenum were co-sputtered by using a silicon target and a molybdenum target, thereby forming a Mo—Si—O layer in the form of film having a thickness of 14 nm on one of the principal surfaces of a transparent substrate. The silicon target was subjected to a pulse sputtering with a pulse width of 5 μsec under conditions of a frequency of 20 kHz, a power density of 4.6 W/cm$^2$ and an inversion pulse width of 5 μse. The molybdenum target was subjected to a pulse sputtering with a pulse width of 5 μsec under conditions of a frequency of 20 kHz, a power density of 4.0 W/cm$^2$ and an inversion pulse width of 5 μsec.

Next, while a gas mixture prepared by mixing 40% by volume of oxygen gas with argon gas was introduced, pulse sputtering with a pulse width of 5 μsec was carried out by using a silicon target under conditions of a pressure of 0.3 Pa, a frequency of 20 kHz, a power density of 3.8 W/cm$^2$ and an inversion pulse width of 5 μsec, thereby forming a layer of silicon oxide (silica ($SiO_2$)) in the form of film having a thickness of 35 nm.

Then, while a gas mixture prepared by mixing 10% by volume of oxygen gas with argon gas was introduced and a pressure of 0.3 Pa was maintained, silicon and molybdenum were co-sputtered by using a silicon target and a molybdenum target, thereby forming a Mo—Si—O layer in the form of film having a thickness of 120 nm. The silicon target was subjected to a pulse sputtering with a pulse width of 5 μsec under conditions of a frequency of 20 kHz, a power density of 4.6 W/cm$^2$ and an inversion pulse width of 5 μse. The molybdenum target was subjected to a pulse sputtering with a pulse width of 5 μsec under conditions of a frequency of 20 kHz, a power density of 4.0 W/cm$^2$ and an inversion pulse width of 5 μsec.

Subsequently thereto, while a gas mixture prepared by mixing 40% by volume of oxygen gas with argon gas was introduced, pulse sputtering with a pulse width of 5 μsec was carried out by using a silicon target under conditions of a pressure of 0.3 Pa, a frequency of 20 kHz, a power density of 3.8 W/cm$^2$ and an inversion pulse width of 5 μsec, thereby forming a layer of silicon oxide (silica ($SiO_2$)) in the form of film having a thickness of 90 nm.

The obtained antireflective film of the multilayer structure had the following constituent layers which were stacked one after another on one principal surface side of the transparent substrate.

Dielectric layer (1): Mo—Si—O layer (thickness: 14 nm)
Dielectric layer (2): $SiO_2$ layer (thickness: 35 nm)
Dielectric layer (3): Mo—Si—O layer (thickness: 120 nm)
Dielectric layer (4): $SiO_2$ layer (thickness: 90 nm)

From the analysis by XPS, the compositional ratio between Mo and Si in each of Mo—Si—O layers of the dielectric layers (1) and (3), namely Mo:Si, was found to be 50:50 (wt %). Each of these Mo—Si—O layers had a refractive index at a wavelength of 550 nm being 1.7 and an extinction coefficient at a wavelength of 550 nm being 0.15.

The evaluations as described above were carried out on the thus prepared antireflective-film attached transparent substrate. The results obtained are shown below in Table 5.

TABLE 1

| | | Example 1 | Example 2 | Example 3 |
|---|---|---|---|---|
| Layer structure | Substrate | Glass | Glass | Glass |
| | Dielectric layer (1) | Ag—$SO_2$ [20 nm] | Cu—$SiO_2$ [80 nm] | Ag—$TiO_2$ [22 nm] |
| | Dielectric layer (2) | $TiO_2$ [25 nm] | $SiO_2$ [40 nm] | $SiO_2$ [105 nm] |
| | Dielectric layer (3) | $SiO_2$ [120 nm] | — | — |
| | Dielectric layer (4) | — | — | — |
| Film forming method | | Usual sputtering | Usual sputtering | Digital sputtering |
| Sheet resistance ($\Omega/\square$) | | $1 \times 10^8$ | $3 \times 10^6$ | $5 \times 10^6$ |
| Luminous reflectance (%) | | 0.5 | 0.8 | 0.9 |
| Luminous transmittance (%) | | 77 | 75 | 80 |
| Transmission color b* | | 2.1 | 3.5 | 2.1 |

TABLE 2

| | | Example 4 | Example 5 | Example 6 |
|---|---|---|---|---|
| Layer structure | Substrate | Glass | Glass | Glass |
| | Dielectric layer (1) | Mo—$SiO_2$ [30 nm] | Ag—$Nb_2O_5$ [13 nm] | Ag—$Nb_2O_5$ [25 nm] |
| | Dielectric layer (2) | $SiO_2$ [100 nm] | $SiO_2$ [26 nm] | $SiO_2$ [30 nm] |
| | Dielectric layer (3) | — | $Nb_2O_5$ [100 nm] | Ag—$Nb_2O_5$ [125 nm] |
| | Dielectric layer (4) | — | $SiO_2$ [95 nm] | $SiO_2$ [95 nm] |
| Film forming method | | Usual sputtering | Usual sputtering | Digital sputtering |
| Sheet resistance ($\Omega/\square$) | | $1 \times 10^{10}$ | $2 \times 10^{10}$ | $1 \times 10^9$ |
| Luminous reflectance (%) | | 0.9 | 0.3 | 0.7 |
| Luminous transmittance (%) | | 70 | 82 | 48 |
| Transmission color b* | | 4.6 | 1.9 | −3 |

TABLE 3

| | | Example 7 | Example 8 |
|---|---|---|---|
| Layer structure | Substrate | Glass | Glass |
| | Dielectric layer (1) | Ag—SiN [25 nm] | $Nb_2O_5$ [8 nm] |
| | Dielectric layer (2) | $SiO_2$ [90 nm] | AgPd1%—$SiO_2$ [25 nm] |
| | Dielectric layer (3) | — | $Nb_2O_5$ [112 nm] |
| | Dielectric layer (4) | — | $SiO_2$ [90 nm] |
| Film forming method | | Usual sputtering | Digital sputtering |
| Sheet resistance ($\Omega/\square$) | | $3 \times 10^9$ | $2 \times 10^7$ |
| Luminous reflectance (%) | | 0.8 | 0.3 |
| Luminous transmittance | | 60 | 84 |

TABLE 3-continued

|  | Example 7 | Example 8 |
|---|---|---|
| Transmission color b* (%) | −6 | 0.5 |

TABLE 4

|  |  | Comparative Example 1 | Comparative Example 2 | Comparative Example 3 |
|---|---|---|---|---|
| Layer structure | Substrate | Glass | Glass | Glass |
|  | Dielectric layer (1) | CuO [10 nm] | TiN [10 nm] | Ag—SiO$_2$ [100 nm] |
|  | Dielectric layer (2) | SiO$_2$ [45 nm] | SiO$_2$ [80 nm] | — |
|  | Dielectric layer (3) | CuO [15 nm] | — | — |
|  | Dielectric layer (4) | SiO$_2$ [100 nm] | — | — |
| Film forming method |  | Usual sputtering | Usual sputtering | Usual sputtering |
| Sheet resistance (Ω/□) |  | 1 × 10$^8$ | 1.5 × 10$^2$ | 1 × 10$^9$ |
| Luminous reflectance (%) |  | 0.8 | 0.2 | 5 |
| Luminous transmitlance (%) |  | 70 | 70 | 67 |
| Transmission color b* |  | 16 | 1.5 | 12 |

TABLE 5

|  |  | Example 9 | Example 10 | Comparative Example 4 |
|---|---|---|---|---|
| Layer structure | Substrate | Glass | Glass | Glass |
|  | Dielectric layer (1) | Mo—Si—O [14 nm] | Mo—Si—O [14 nm] | Mo—Si—O [14 nm] |
|  | Dielectric layer (2) | SiO$_2$ [35 nm] | SiO$_2$ [35 nm] | SiO$_2$ [35 nm] |
|  | Dielectric layer (3) | Mo—Si—O [120 nm] | Mo—Si—O [120 nm] | Mo—Si—O [120 nm] |
|  | Dielectric layer (4) | SiO$_2$ [90 nm] | SiO$_2$ [90 nm] | SiO$_2$ [90 nm] |
| Film forming method |  | Usual sputtering | Usual sputtering | Usual sputtering |
| Sheet resistance (Ω/□) |  | 4.8 × 10$^8$ | 3.7 × 10$^7$ | 5 × 10$^9$ |
| Luminous reflectance (%) |  | 0.3 | 0.4 | 0.6 |
| Luminous transmittance (%) |  | 80 | 80 | 75 |
| Transmission color b* |  | 1.6 | 1.1 | 7 |
| Mo:Si (wt %) |  | 99:1 | 90:10 | 50:50 |
| Si/(Mo + Si) (%) |  | 1 | 10 | 50 |

TABLE 6

|  |  | Example 11 | Example 12 |
|---|---|---|---|
| Layer structure | Substrate | Glass | Glass |
|  | Layer (1) | Mo—Nb—O [14 nm] | Mo—Nb—O [14 nm] |
|  | Layer (2) | SiO$_2$ [35 nm] | SiO$_2$ [35 nm] |
|  | Layer (3) | Mo—Nb—O [120 nm] | Mo—Nb—O [110 nm] |
|  | Layer (4) | SiO$_2$ [90 nm] | SiO$_2$ [90 nm] |
| Film forming method |  | Usual sputtering | Usual sputtering |
| Sheet resistance (Ω/□) |  | 1.2 × 10$^9$ | 3.7 × 10$^7$ |
| Luminous reflectance (%) |  | 0.25 | 0.3 |
| Luminous transmittance (%) |  | 84 | 70 |
| Transmission color b* |  | −0.2 | 0.5 |
| Mo:Nb (wt) |  | 80:20 | 50:50 |
| Nb/(Mo + Nb) (%) |  | 20 | 50 |

TABLE 7

|  |  | Example 13 |
|---|---|---|
| Layer structure | Substrate | Glass |
|  | Layer (1) | Mo—Ti—O [12 nm] |
|  | Layer (2) | SiO$_2$ [30 nm] |
|  | Layer (3) | Mo—Ti—O [106 nm] |
|  | Layer (4) | SiO$_2$ [80 nm] |
| Film forming method |  | Usual sputtering |
| Sheet resistance (Ω/□) |  | 3.2 × 10$^8$ |
| Luminous reflectance (%) |  | 0.25 |
| Luminous transmittance (%) |  | 79 |
| Transmission color b* |  | 0.5 |
| Mo:Ti (wt) |  | 93:7 |
| Ti/(Mo + Ti) (%) |  | 7 |

Each of the antireflective-film attached transparent substrates prepared in Examples 1 to 10 had a sheet resistance of its antireflective films being 10$^4$Ω/□ or higher, a luminous reflectance of its antireflective films being 1% or lower, and a luminous transmittance being from 20% to 85%, and a b* value of transmission light being 5 or smaller under a D65 light source.

On the other hand, the antireflective-film attached transparent substrate prepared in Comparative Example 1, any of whose constituent layers was not a dielectric layer in which fine particles were dispersed, had a b* value of transmission light being greater than 5 under a D65 light source.

In addition, the antireflective-film attached transparent substrate prepared in Comparative Example 2, in which the film of continuous TiN was formed as the dielectric layer (1), had a sheet resistance of its antireflective film being lower than 10$^4$Ω/□.

Furthermore, the antireflective-film attached transparent substrate prepared in Comparative Example 3, in which the single film of Ag-fine-particles dispersed SiO$_2$ layer (thickness: 100 nm) was formed as its dielectric layer, had a luminous reflectance of its antireflective film being higher than 1% and had a b* value of transmission light being greater than 5 under a D65 light source.

Furthermore, the antireflective-film attached transparent substrate prepared in Comparative Example 4, in which the layers (1) and (3) were Mo—Si—O layers whose compositional ratio between Si and Mo, Mo:Si, being 50:50 (wt %), had a b* value of transmission light greater than 5 under a D65 light source.

Although the present invention has been described in detail and by reference to the specific embodiments, it is apparent to one skilled in the art that various modifications or changes can be made without departing the spirit and scope of the present invention.

The present application is based on Japanese Patent Application No. 2017-005124 filed on Jan. 16, 2017, the contents of which are incorporated herein by reference.

DESCRIPTION OF REFERENCE NUMERALS AND SIGNS

10: Transparent substrate
20, 30: Antireflective film
22, 26, 32, 34: Dielectric layer
24: Fine particles

What is claimed is:

1. An antireflective-film attached transparent substrate, comprising a transparent substrate having two principal surfaces and an antireflective film formed on one of the principal surfaces of the transparent substrate, wherein the antireflective-film attached transparent substrate has a luminous transmittance being in a range of 20% to 84% and a b* value of a transmission color being 5 or smaller under a D65 light source, and wherein the antireflective film has a luminous reflectance being 1% or lower and a sheet resistance being $10^4 \Omega/\square$ or higher, wherein the transparent substrate is a chemically-strengthened glass substrate.

2. The antireflective-film attached transparent substrate according to claim 1, further comprising an antifouling film on the antireflective film.

3. The antireflective-film attached transparent substrate according to claim 1, wherein the principal surface of the glass substrate on which the antireflective film is to be formed, has undergone an antiglare treatment.

4. An antireflective-film attached transparent substrate, comprising a transparent substrate having two principal surfaces and an antireflective film formed on one of the principal surfaces of the transparent substrate, wherein the antireflective-film attached transparent substrate has a luminous transmittance being in a range of 20% to 84% and a b* value of a transmission color being 5 or smaller under a D65 light source, and wherein the antireflective film has a luminous reflectance being 1% or lower and a sheet resistance being $10^4 \Omega/\square$ or higher, wherein the antireflective film has a multilayer structure built up of at least two dielectric layers differing from each other in refractive index, each dielectric layer in the multilayer structure is constituted mainly of at least one oxide selected from the group consisting of oxides of Si, Nb, Ti, Zr, Ta, Al, Sn, and In or constituted mainly of at least one nitride selected from the group consisting of nitrides of Si and Al, and at least one layer of the antireflective film with the multilayer structure contains dispersed fine particles of at least one chemical species selected from the group consisting of Ag, Mo, W, Cu, Au, Pd, Pt, Ir, Ni, Co, Fe, Cr, C, TiC, SiC, TiN, and CrN.

5. The antireflective-film attached transparent substrate according to claim 4, further comprising an antifouling film on the antireflective film.

6. The antireflective-film attached transparent substrate according to claim 4, wherein the transparent substrate is a glass substrate.

7. The antireflective-film attached transparent substrate according to claim 6, wherein the glass substrate is a chemically-strengthened glass substrate.

8. The antireflective-film attached transparent substrate according to claim 7, wherein the principal surface of the glass substrate on which the antireflective film is to be formed, has undergone an antiglare treatment.

9. The antireflective-film attached transparent substrate according to claim 4, wherein the principal surface of the transparent substrate on which the antireflective film is to be formed, has undergone an antiglare treatment.

10. An antireflective-film attached transparent substrate, comprising a transparent substrate having two principal surfaces and an antireflective film formed on one of the principal surfaces of the transparent substrate, wherein the antireflective-film attached transparent substrate has a luminous transmittance being in a range of 20% to 84% and a b* value of a transmission color being 5 or smaller under a D65 light source, and wherein the antireflective film has a luminous reflectance being 1% or lower and a sheet resistance being $10^4 \Omega/\square$ or higher, wherein the antireflective film has a multilayer structure built up of at least two layers differing from each other in refractive index, at least one layer of the layers in the multilayer structure is constituted mainly of silicon oxide, at least another layer of the layers in the multilayer structure is constituted mainly of a mixed oxide of at least one oxide selected from the group A consisting of oxides of Mo and W and at least one oxide selected from the group B consisting of oxides of Si, Nb, Ti, Zr, Ta, Al, Sn, and In, and the proportion of the content of the oxide of the group B to the total content of the oxide of the group A and the oxide of the group B in the mixed oxide is lower than 50% by mass.

11. The antireflective-film attached transparent substrate according to claim 10, wherein the principal surface of the transparent substrate on which the antireflective film is to be formed, has undergone an antiglare treatment.

12. The antireflective-film attached transparent substrate according to claim 10, further comprising an antifouling film on the antireflective film.

13. The antireflective-film attached transparent substrate according to claim 10, wherein the transparent substrate is a glass substrate.

14. The antireflective-film attached transparent substrate according to claim 13, wherein the glass substrate is a chemically-strengthened glass substrate.

15. The antireflective-film attached transparent substrate according to claim 14, wherein the principal surface of the glass substrate on which the antireflective film is to be formed, has undergone an antiglare treatment.

* * * * *